(12) United States Patent
Polonsky et al.

(10) Patent No.: US 12,399,196 B2
(45) Date of Patent: Aug. 26, 2025

(54) TERMINAL SENSOR ARRAY

(71) Applicant: Solaredge Technologies Ltd., Herzeliya (IL)

(72) Inventors: Nimrod Polonsky, Tel Aviv (IL); Liron Har-Shai, Tel Mond (IL); Yoav Galin, Raanana (IL); Bryon Gomberg, Kfar Saba (IL); Guy Sella, Bitan Aharon (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 18/543,117

(22) Filed: Dec. 18, 2023

(65) Prior Publication Data

US 2024/0118311 A1 Apr. 11, 2024

Related U.S. Application Data

(63) Continuation of application No. 17/005,494, filed on Aug. 28, 2020, now Pat. No. 11,879,911.

(60) Provisional application No. 62/893,253, filed on Aug. 29, 2019.

(51) Int. Cl.
   *G01R 1/067* (2006.01)
   *G01R 31/327* (2006.01)
   *H01R 9/24* (2006.01)

(52) U.S. Cl.
   CPC ......... *G01R 1/067* (2013.01); *G01R 31/3271* (2013.01); *H01R 9/24* (2013.01)

(58) Field of Classification Search
   None
   See application file for complete search history.

(56) References Cited

U.S. PATENT DOCUMENTS

| | | | |
|---|---|---|---|
| 5,073,402 A | 12/1991 | Henderson | |
| 5,644,245 A | 7/1997 | Saitoh et al. | |
| 9,354,158 B1* | 5/2016 | van Dijk | H01R 43/26 |
| 9,825,459 B2 | 11/2017 | Buehman et al. | |
| 2006/0052905 A1 | 3/2006 | Pfingsten et al. | |
| 2010/0176828 A1 | 7/2010 | Eccleston et al. | |
| 2016/0006300 A1 | 1/2016 | Grujovski et al. | |

(Continued)

FOREIGN PATENT DOCUMENTS

| CN | 107290620 A | 10/2017 |
|---|---|---|
| EP | 2105995 A1 | 9/2009 |

(Continued)

OTHER PUBLICATIONS

Markowitz Maury; Modular Electrical Connector Apparatus and Method for Rapid Assembly of Photovoltaic Arrays; CA 2762078 A1; Date Published Jun. 16, 2013; (Year: 2013).*

(Continued)

*Primary Examiner* — Nasima Monsur
(74) *Attorney, Agent, or Firm* — Banner & Witcoff, Ltd.

(57) ABSTRACT

An apparatus having a conducting probe configured to couple with an electrical conductor of an electrical terminal. The apparatus has a sensor in contact with the conducting probe. The apparatus has a controller electrically coupled to the sensor, where the controller is configured to monitor the sensor values, and when the sensor values comply with a monitoring rule associated with a hazardous condition, the controller is configured to initiate an action to mitigate the hazardous condition.

20 Claims, 7 Drawing Sheets

(56) References Cited

U.S. PATENT DOCUMENTS

| | | |
|---|---|---|
| 2016/0143141 A1 | 5/2016 | Ku et al. |
| 2016/0172781 A1* | 6/2016 | Nunner .................. H01R 4/38 |
| | | 439/660 |
| 2017/0168120 A1 | 6/2017 | Gach et al. |
| 2018/0048090 A1* | 2/2018 | Kawai ................ H01R 13/5829 |
| 2018/0188295 A1* | 7/2018 | Kameko ................ H01C 13/00 |
| 2018/0252758 A1* | 9/2018 | Turner ............. G01R 19/16538 |

FOREIGN PATENT DOCUMENTS

| | | |
|---|---|---|
| EP | 3318884 A1 | 5/2018 |
| KR | 101016770 B1 | 2/2011 |
| KR | 20150025052 A | 3/2015 |
| WO | 2007027702 A2 | 3/2007 |
| WO | 2017174994 A1 | 10/2017 |

OTHER PUBLICATIONS

Jumper bar IVB WKF 4-5 data sheet; Wieland; retrieved from https://eshop.wieland-electric.com/products/da/laske-ivb-wkf-4-5/Z7.261.1527.0?locale=en#datasheet, Jun. 2015.

Jan. 22, 2021—EP EESR—EP 20193381.9.

Nolte et al. ; Borehole probe For Impulse Seismic Measurements; EP 0412384 A2; Berkenbusch Hans-Juergen; Feb. 13, 1991 (Year: 1991).

Stiewe Thomas; Rail for terminal blocks used in motor vehicles; Publication DE19517396A1 Nov. 21, 1996; Pheonix Contact GMBH & Co; (Year: 1996).

* cited by examiner

TERMINAL SENSOR ARRAY

CROSS-REFERENCE TO RELATED APPLICATIONS

The present application is a continuation of U.S. application Ser. No. 17/005,494, filed Aug. 28, 2020, which claims priority to U.S. Provisional Application No. 62/893,253, filed Aug. 29, 2019, each of which is hereby incorporated by reference in its entirety.

BACKGROUND

The present disclosure relates to the field of electronic components and devices containing electronic components.

The terminals of power devices may have low contact resistance to, for example, limit power losses and/or reduce heat generation. The terminal size/type and wire gauge may be determined by the maximum current rating. For low currents, thin wires and small terminals may be used, and for high currents, large wires and terminals may be used. Units are abbreviated here and throughout the disclosure as millimeter (mm), millimeter square (mm$^2$), 1000 circular mils (kcmil), meter (m), milli-ohm (mΩ), degrees centigrade (° C.), and amperes (A). For example, a wire gauge of 8 American Wire Gauge (AWG) may have a maximum current rating of 20 A (when at 6 meters length) and may be connected to a terminal block, such as WAGO® model 284-101. For example, a wire gauge of 6 AWG may have a maximum current rating of 70 A (when up to a length of 3 meters) and use a terminal having at least as a 16 mm$^2$ wire cross section capability, such as Weidmüller® type WPE 10 part number 1010300000. Wire gauges may range from very small sizes to very large size, where some of the sizes are listed in the following table:

For multiple terminals located adjacent to one another, terminal blocks attached to a support may be used. The terminal blocks comprise multiple terminals arranged in tiers or along rows, and may be mechanically coupled to a support, such as a rail, a printed circuit board, or an enclosure. When mechanically coupled to a wall of a structure or an enclosure, a Deutsches Institut für Normung (DIN) rail may be used. The DIN rail is a metal profile, usually from cold rolled steel with zinc plating, where the DIN rail is attached to a wall, cabinet, and/or a device enclosure, using bolts or screws, and the DIN rail holds terminal blocks in place. The terminal blocks may snap on to the DIN rail. Although made form a conducting metal, the DIN rail is not used as a busbar for conducting electrical current, but may be used as an electrical ground connection. DIN rails may have a top hat profile (such as top hat rail IEC/EN 60715-35×7.5), a C-section profile (such as AS 2756.1997 C20 or C30), or a G-section profile (such as EN 50035, BS 5825, or DIN 46277-1).

DIN rail terminal blocks may have one or more recesses for incorporation of jumpers, such as bridge jumpers, where the jumpers may be used to connect electrically between two otherwise electrically isolated terminals. A recess passes through the housing and internal conductor of each terminal block, and may have a shape and size with a cross section matching the current rating of the terminal block, a mechanical strength requirement. The recess through the internal conductor is sized slightly (such as 1 mm) smaller than the recess size of the housing. The terminals connected by the jumper may be adjacent, non-adjacent, consecutive, and/or alternating. In some configurations, additional terminals may be incorporated onto the jumper to allow electrical access to the main conductor of the terminal block.

TABLE 1

| | Copper wire | | | | | | |
|---|---|---|---|---|---|---|---|
| | Diameter | Area | | Resistance/ length | Ampacity, at 20° C. insulation material temperature rating | | |
| | | | | | 60° C. | 75° C. | 90° C. |
| AWG | (mm) | (kcmil) | (mm$^2$) | (mΩ/m) | (A) | | |
| 0000 (4/0) | 11.684 | 212 | 107 | 0.1608 | 195 | 230 | 260 |
| 000 (3/0) | 10.405 | 168 | 85 | 0.2028 | 165 | 200 | 225 |
| 00 (2/0) | 9.266 | 133 | 67.4 | 0.2557 | 145 | 175 | 195 |
| 0 (1/0) | 8.251 | 106 | 53.5 | 0.3224 | 125 | 150 | 170 |
| 1 | 7.348 | 83.7 | 42.4 | 0.4066 | 110 | 130 | 145 |
| 2 | 6.544 | 66.4 | 33.6 | 0.5127 | 95 | 115 | 130 |
| 3 | 5.827 | 52.6 | 26.7 | 0.6465 | 85 | 100 | 115 |
| 4 | 5.189 | 41.7 | 21.2 | 0.8152 | 70 | 85 | 95 |
| 5 | 4.621 | 33.1 | 16.8 | 1.028 | | | |
| 6 | 4.115 | 26.3 | 13.3 | 1.296 | 55 | 65 | 75 |
| 7 | 3.665 | 20.8 | 10.5 | 1.634 | | | |
| 8 | 3.264 | 16.5 | 8.37 | 2.061 | 40 | 50 | 55 |
| 9 | 2.906 | 13.1 | 6.63 | 2.599 | | | |
| 10 | 2.588 | 10.4 | 5.26 | 3.277 | 30 | 35 | 40 |
| 11 | 2.305 | 8.23 | 4.17 | 4.132 | | | |
| 12 | 2.053 | 6.53 | 3.31 | 5.211 | 20 | 25 | 30 |
| 13 | 1.828 | 5.18 | 2.62 | 6.571 | | | |
| 14 | 1.628 | 4.11 | 2.08 | 8.286 | 15 | 20 | 25 |
| 15 | 1.45 | 3.26 | 1.65 | 10.45 | | | |
| 16 | 1.291 | 2.58 | 1.31 | 13.17 | | | 18 |
| 17 | 1.15 | 2.05 | 1.04 | 16.61 | | | |
| 18 | 1.024 | 1.62 | 0.823 | 20.95 | 10 | 14 | 16 |

SUMMARY

The following summary is a short summary of some of the inventive concepts for illustrative purposes only and is not an extensive overview, and is not intended to identify key or critical elements, or to limit or constrain the inventions and examples in the detailed description. One skilled in the art will recognize other novel combinations and features from the detailed description.

According to aspects of the disclosure herein, an apparatus comprises one or more thermal conductors configured in size and shape to fit into one or more recesses of a DIN rail terminal block, and couple thermally with internal conductors of the terminal blocks. Temperature sensors are in thermal contact with the thermal conductors, and convert the sensed temperatures to electrical properties, such as a voltage, a current, a resistance, and/or an impedance. Conductors may electrically couple the sensors to a circuit, transferring the electrical property to the circuit. The circuit may comprise a digital controller that may convert the electrical properties from the sensors to digital values. The circuit may comprise an analog controller circuit that may convert the electrical properties (analog values) from the sensors to a mitigating action using analog components. As used herein, the term controller circuit may mean an analog controller circuit, a digital controller circuit, or a combined analog and digital controller circuit, and the term controller may be used in lieu of controller circuit. The controller circuit may monitor the temperatures of the internal conductors of the terminal blocks, and when the temperatures of one or more internal conductors is abnormal, the controller may mitigate the abnormality, such as by sending a notification and/or lowering the current passing through that terminal.

As noted above, this Summary is merely a summary of some of the aspects and features described herein. It is not exhaustive, and it is not to be a limitation on the claims.

BRIEF DESCRIPTION OF THE DRAWINGS

These and other features, aspects, and advantages of the present disclosure will become better understood with regard to the following description, claims, and drawings. The present disclosure is illustrated by way of example, and not limited by, the accompanying figures. In the drawings, like numerals reference similar elements.

DETAILED DESCRIPTION

The accompanying drawings, which form a part hereof, show examples of the disclosure. It is to be understood that the examples shown in the drawings and/or discussed herein are non-exclusive and that there are other examples of how the disclosure may be practiced.

Disclosed herein are sensor devices for detecting and preventing overheating of terminal blocks. The sensor devices may comprise any of a sensor, a conducting probe, a controller, and a body. The conductor may be connected to an electrical conductor of the terminal block, such as the conductor inserted into one or more recesses of a multiple contact terminal block and/or the conductor clamped on a terminal lug. The controller may monitor the sensor, and when there is an abnormal sensor reading, the controller may initiate mitigating actions, notify a user, derate a power device, lower a current, and/or open a relay/switch. For example, when a sensor's value is above or below a threshold, the sensor's value may indicate that the resistance of the terminal block is above a threshold, thereby producing more heat, comprising an increased temperature.

As used herein, the term controller means any sensor signal processing circuit that may monitor the terminal block and when the sensor values trigger a monitoring rule, such as a rule associated with a hazardous condition, an action is initiated by the controller to mitigate the abnormal sensor values. For example, the controller may be a central processor, a hardware processor, a processing unit, a digital signal processor, a multicore processing unit, a field programmable gate array, an analog control circuit, and/or a digital control circuit.

The sensor may be a temperature sensor connected to a thermal conductor. When located within a recess of the terminal block, the thermal conductor contacts an internal electrical conductor of the terminal block. When there is overheating of the internal conductor, the controller monitoring the sensor may take appropriate action to reduce the overheating, such as lowering the current through the terminal block, notifying a user to tighten/replace the terminal block, and/or stopping operation of equipment attached to the terminal block.

The sensor may be a voltage sensor and the conductor contacts a terminal lug connected to the terminal block. By comparing the voltage drop across the terminal block and the current through the electrical conductor, the resistance of the terminal block may be monitored. The resistance and current may determine the heat generation within the terminal block, and therefore monitoring the resistance may be used to predict when a high current may generate an overheating of the terminal block. When the resistance is abnormal, such as above a threshold, an outlier relative to historic resistance values, and/or an outlier when compared to the resistance values of other terminal blocks, the controller monitoring the sensor may take appropriate action to reduce the resistance before the resistance causes the terminal block to overheat.

According to some aspects, the recess of the terminal block may be used for jumpers, such as bridges, that may short circuit between two terminal blocks. In some aspects, the recesses are on the forward facing (front) portion of the terminal block. In some aspects, the recesses are near the electrical wire insertion cavity of the terminal block. The sensor device may have a protruding structure configured to enter the recess, and a similar recess at the other side to accept a bridge or jumper for short circuiting between the terminal blocks. The combination of protruding structure and recess, such as a male-female arrangement, may allow the sensor device to operate as a pass-through conductor for the electrical connection and may also allow thermally coupling a temperature sensor to the terminal block conductor. Multiple sensor devices may be configured to be inserted as a single unit into multiple recesses of one or more adjacent terminal blocks on the same DIN rail, such as multiple probes/sensors arranged in a comb-shaped structure. The multiple probes/sensors may be electrically and/or thermally isolated from each other so that a separate short-circuiting bridge device provides a short-circuit connection between terminal blocks. The temperature sensors may be used to monitor the temperature of the conductor (and the terminals) of each terminal block individually and/or separately.

Figure 1A:
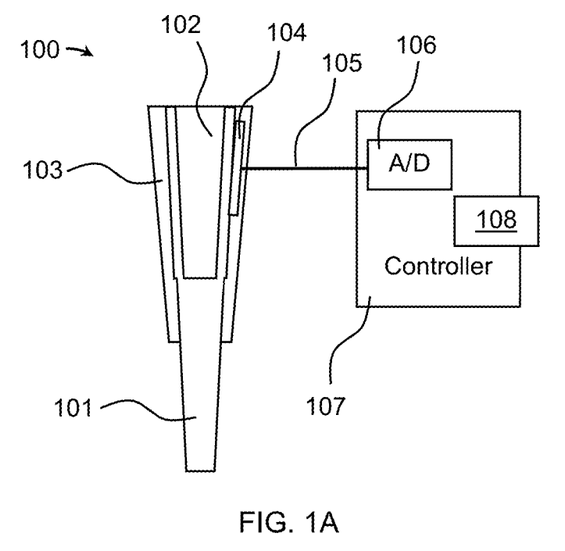
FIG. 1A shows, schematically, an example terminal block jumper pass-thru sensor apparatus.

Reference is now made to FIG. 1A, which shows, schematically, an example terminal block jumper pass-thru sensor apparatus 100. Apparatus 100 comprises a conducting probe 101, one or more sensors such as at 104, an electrical connection 105 to a controller 107, and the controller 107. The conducting probe 101 may be sized and shaped to be inserted into a recess (not shown) of a terminal block, a terminal lug, and/or an electrical terminal. An insulating cover 103 may protect the conducting probe from coming in electrical or thermal contact with other components. A recess 102 may be included in the apparatus 100, and the recess 102 may allow a terminal block bridge or jumper (not shown, such as WAGO® part number 870-404, Phoenix Contact part number 3032143, International Connector Inc. part number DSS4N-10P) to be inserted into the recess, and thereby electrically connect to one or more internal conductors of the terminal blocks. The controller 107 may comprise an analog to digital converter 106 (such as may be incorporated into embedded controllers), and an interface 108 for communicating commands to a power device, alerts to a power device, and/or notifications to a user interface. The controller 107 may be configured, such as using customized program code, to monitor the temperature or voltage values of the terminal block conductor, and/or terminal lug. When the sensors' 104 values (such as values representing a current, a voltage, a temperature, and/or an electromagnetic radiation) comply with an abnormality rule, the controller 107 may be configured to command a power device to lower the current flowing through the terminal block conductor (such as to lower the heat generated), send an alert to a power device using the interface 108, and/or send an alert to a user interface (not shown) using the interface 108.

The interface 108 may comprise any of a digital data interface, an acoustic interface, a wireless interface, and/or a wired interface. The interface may be used to:
  receive power from a power supply, a host device, a
    circuit board, and/or a power converter,
  send sensor data to a host device,
  send alerts to a user interface,
  send messages, warnings, critical alerts, and/or commands to a host device.

Interface 108 may be implemented using electrical conductors, such as a data cable, a wireless interface, such as Bluetooth®, Wi-Fi™, RFID, and/or Zigbee. A single interface may be used for multiple sensors to lower costs (such as assembly and/or components), and/or improve reliability (fewer components, connections, etc.). Multiple interfaces, such as combining a wireless interface and a wired interface, may be used to provide power with a wired interface and transmit apparatus generated data, such as sensor readings, alerts, warnings, and/or messages.

One or more sensor apparatuses 100 may be incorporated into a terminal box, junction box, power device, power converter, a power generation system, a power transfer system, an electrical cabinet, and/or a vehicle electrical system. For example, sensor apparatuses may be incorporated into junction boxes between power devices of a power generation system, such as junction boxes between string inverters, parallel inverters, and/or power distribution systems. The sensor apparatus may send a message to a host device/system, when a monitored sensor reports an abnormal value. For example, the message may be a digital message comprising one or more values (such as a command code or value, a percentage value, etc.) signaling the host device to lower the current through the junction box.

A mechanical actuator may be controllable by the sensor apparatus 100, such as a mechanical lever, that disconnects a conductor, thereby stopping a current flow through a terminal block. For example, an overcurrent protection device may be incorporated into a junction box terminal block, and the controller of the sensor apparatus 100 may send a signal to the overcurrent protection mechanism to trigger an electrical and/or mechanical disconnection of a mechanical lever. The mechanical actuator may be incorporated into a "fail-safe" terminal block, for example that incorporates the sensor monitoring and disconnects when overheating. For example, the apparatus comprising a sensor and/or a controller, may be incorporated in or on a mechanical element used to electrically and/or mechanical disconnect the terminal block internal conductor, such as using a knife blade disconnect element, a circuit breaker element, and/or an over-current protection element.

Figure 1B:
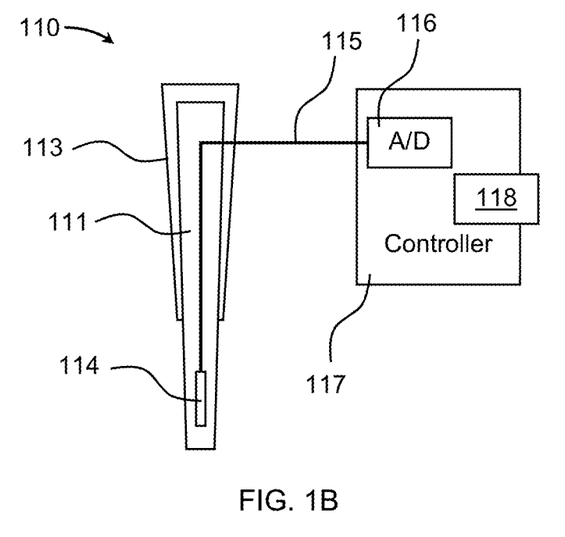
FIG. 1B shows, schematically, an example terminal block sensor apparatus.

Reference is now made to FIG. 1B, which shows, schematically, an example terminal block jumper sensor apparatus 110. Many elements of the figures, such as FIG. 1B, have similar corresponding elements in other figures, such as FIG. 1A, and for the sake of brevity in this document, at least some references to similar elements in other figures may be omitted but it may be identified that similar elements are set as alternative examples in different figures. The sensor apparatus 110 may comprise a sensor 114 located in contact with a probe 111. Insulation 113 may cover probe 111 at least in part. A connector 115 may be used to transfer a sensor reading, such as a sensor output voltage, from the sensor 114 to the controller 117. Controller 117 may convert the analog reading to a digital value, such as using an analog-to-digital converter 116 (A/D). The controller 117 may be configured to monitor sensor 114 readings, and when a sensor reading complies with an abnormal reading rule (such as stored on the controller, not shown) the controller 117 may initiate an action to warn or mitigate the abnormal reading, such as by sending a command to a host device using the interface 118.

Figure 1C:
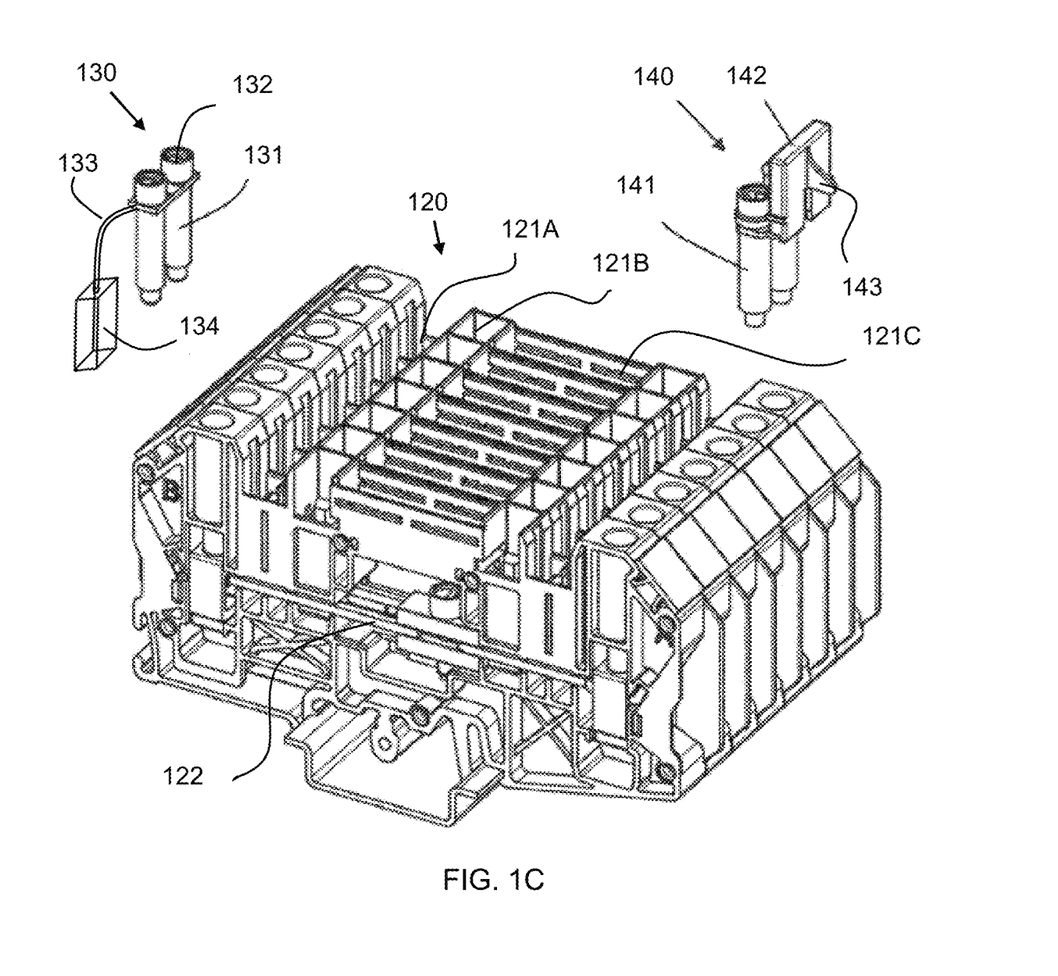
FIG. 1C shows, schematically, an example terminal block including a multiple recess sensor apparatus.

Reference is now made to FIG. 1C, which shows, schematically, an example terminal block 120 including multiple recess sensor apparatuses 130 and 140. The terminal block 120 may comprise multiple recesses as at 121A, 121B, and 121C. The sensor apparatuses 130 and 140 may comprise conducting probes 131 and 141, respectively, each configured in shape and size to pass through one or more of the recesses 121A, 121B, and 121C. When the sensor apparatus 130 or 140 enters one of the recesses 121A, 121B, and 121C, a conducting probe 131 (or 141 for example), contacts an internal conductor 122 of the terminal block 120, thereby conducting a physical property of the internal conductor 122 to the sensor 132. The sensor apparatus 130 may comprise an electrical conductor 133 and a connector 134, that together transfer the electrical signal from the sensor to a controller (not shown), such as a controller on a circuit board. The sensor apparatus 140 may comprise a controller 142, such as an embedded controller. The controller 142 may be incorporated in a power device, a control system, and/or a Supervisory Control and Data Acquisition (SCADA) system. The controller 142 may be configured to:

draw power from two or more probes 141,
monitor sensors integrated with the probes 141,
calculate a compliance with a monitoring rule (stored on the controller 142 or retrieved through a wireless interface 143), and
when sensor reading is not compliant (such as an abnormal reading—e.g., over-current over-temperature, etc.), initiate actions to correct the physical property causing the abnormal sensor reading, such as using the wireless interface 143 to send a command to a power device to lower current through the terminal block and/or notify a user interface of the abnormal sensor reading.

The size of the conducting probe may be determined by the size of the terminal block recess (such as recesses 121A, 121B, and 121C), which in turn may be determined by the ampacity of the terminal block. For example, a terminal block for conducting 195 A may be configured for a 12 mm diameter conductor or a 100 mm$^2$) cross sectional conductor area. A recess for this example may be of the same size or slightly larger to allow for insulation. For example, a jumper recess may have a 5 mm by 20 mm rectangular shape, and/or a 10 mm by 10 mm square shape. The conducting probe tip may comprise a cross section of between 1 and 300 mm$^2$, depending on the terminal block ampacity.

Different makes and models of terminal blocks may have different shaped sizes of recesses, and have specially sized and shaped jumper bridges. Cross section area of the recess is controlled by the rated current, and may be substantially equivalent to the cross section of the internal conductor or the connecting wire rating of the terminal. A sensor apparatus may have a combined shape and size to fit multiple makes and models of terminal blocks.

Figure 2A:
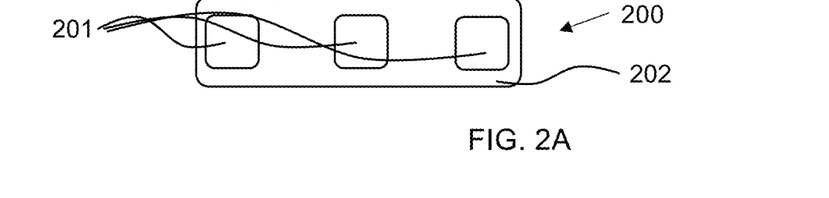
FIG. 2A shows, schematically, a top view of an example three position terminal block jumper pass-through sensor apparatus.

Reference is now made to FIG. 2A, which shows, schematically, a top view of an example three position terminal block jumper pass-through sensor apparatus 200. The sensor apparatus 200 may comprise recesses 201 and a connecting bridge 202, such as made from an insulating material. The probes (not visible in top view) may be configured with a cross-section shaped to enter a recess of a terminal block and connect to the internal conductor of the terminal block, such as comprising a cross-section shaped as a rounded rectangle, a squircle (i.e., a shape intermediate between a square and a circle), or a combination of square and round shapes. For example, a rounded polygon shape may be configured to contact the electrical conductor recess walls by pressing the rounded corners (such as for a round shaped recess) and/or sides (such as for a rectangular shaped recess) of the polygon against the internal conductor. This may have the benefit of a single probe configuration connecting to the internal conductors of multiple makes and models of terminal block recesses.

Figure 2B:
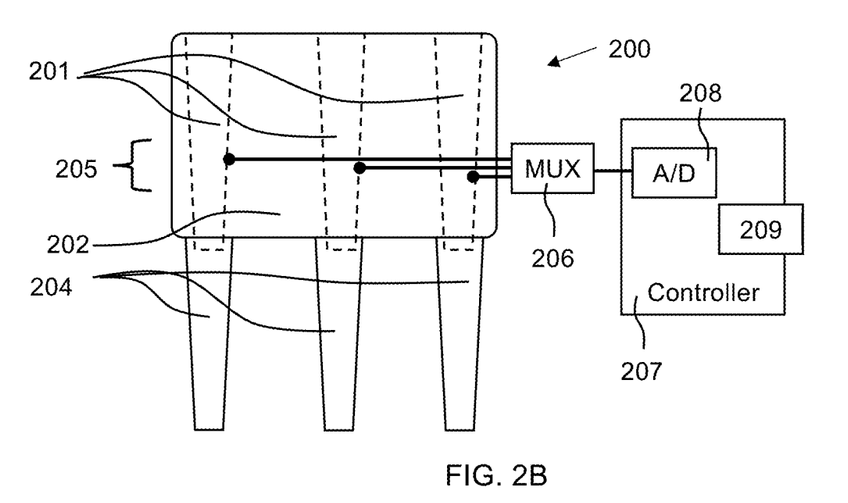
FIG. 2B shows, schematically, a side view of an example three position terminal block jumper pass-through sensor apparatus.

Reference is now made to FIG. 2B, which shows, schematically, a side view of an example three position terminal block jumper pass-through sensor apparatus 200. The sensor apparatus 200 may comprise multiple probes 204 connected to a connecting bridge 202 of the sensor apparatus 200 and may be arranged in a linear array, such as a comb structure. Each probe element of the linear array fits into a recess or a terminal block arranged to match the comb/array structure (such as arranged in spacing, size and shape or probe elements). Recesses 201 may be located opposing the probe structures to allow connection of a jumper or bridge when needed. The sensor apparatus 200 may comprise multiple sensors 205, such as one for each probe 204, connected to a controller 207, such as serially through a multiplexor 206 (MUX). For example, the MUX 206 may send multiple digital or analog values over one or more conductors by sharing the conductors for each sensor transfer. Once a first sensor transfer is complete, the MUX 206 may start sending the second sensor value. In this manner, multiple sensor values may be transferred serially. The controller 207 may comprise A/D converters 208 to convert the sensor measurements to digital values. The controller 207 may be configured to monitor the sensor 205 values, and when one or more values is abnormal, an action or message is initiated by the controller 207 using a data and/or communication interface 209.

In some configurations, adjacent terminal blocks may be of different current ratings and/or sizes, and the conducting probes of the sensor apparatus may be arranged non-linearly, such a zigzag pattern, a traverse or diagonal pattern, or a matching pattern. For example, each probe of the sensor apparatus has a different location corresponding to the location of a recess in the terminal block that probe is configured to enter.

Abnormal sensor values may be determined based on rules, such as different from the other sensor values, different from previous sensor values, different from historically recorded sensor values, and/or above a threshold relative to the current passing through the terminal block associated with specific probe and sensor. For example, a sensor value of a temperature reading corresponding to a temperature of 95° C. may trigger a device shutdown. For example, six sensors monitor six terminal blocks, and five of the sensors report a value corresponding to a temperature of 67° C. and one sensor is 87° C. and as a result a warning is sent to a user interface indicated an abnormal temperature at the terminal block of the 6$^{th}$ sensor.

Figure 3A:
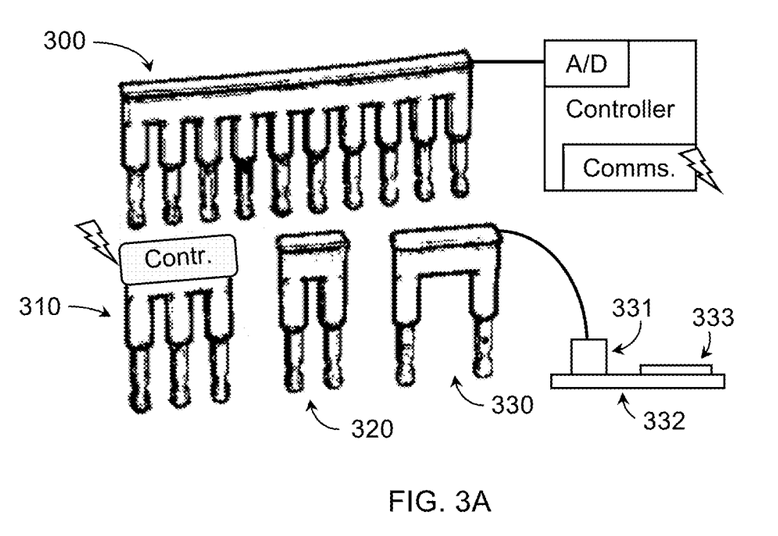
FIG. 3A shows, schematically, examples of jumper sensor apparatuses.

Reference is now made to FIG. 3A, which shows, schematically, examples of sensor apparatuses 300, 310, 320, and 330. Probes, shown as the "teeth" of the linear array, may be arranged in different configurations, such as a 10-probe sensor apparatus 300 with electrical conductors leading to a controller, a three-probe apparatus 310 with an integrated controller, a two-probe sensor apparatus 320 configured for adjacent terminal blocks, a two-probe sensor apparatus 330 configured for non-adjacent terminal blocks (with a connector 331 to a printed circuit board 332 comprising a controller 333). These examples show some of the different configurations of probes (such as matched to the spacing of the terminal blocks), and the integration between possible example sensor probes and configurations of the controller. For example, the controller may be on the probe, near the probe and connected with conductors to the sensors, integrated into a power device, and/or located on a remote server. Any of the example configurations of sensor probes may be matched to any of the examples of the controllers, as long as the controllers are configured to support the specific number of sensors on the probes.

Figure 3B:
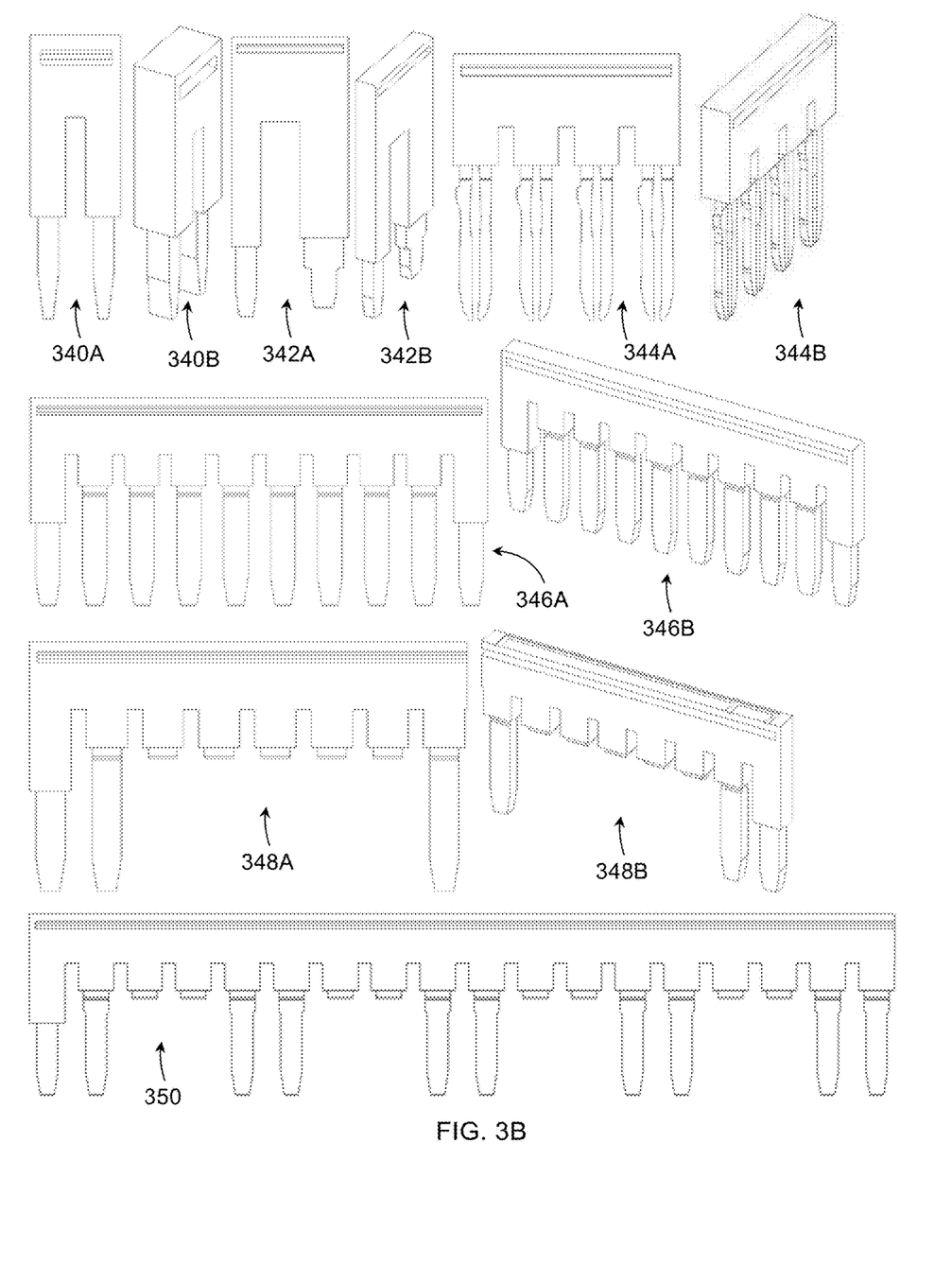
FIG. 3B shows, schematically, further examples of jumper sensor apparatuses.

Reference is now made to FIG. 3B, which shows, schematically, further examples of sensor apparatuses, such as number of probes, positions of probes, etc.:
- a two-probe apparatus for adjacent terminals as at 340A and 340B,
- a two-probe apparatus for adjacent dissimilar terminals (differently sized and shaped) as at 342A and 342B,
- a 4-probe apparatus for adjacent terminals as at 344A and 344B,
- a 10-probe apparatus for adjacent terminals as at 346A and 346B,
- a three-probe apparatus for non-adjacent terminals as at 348A and 348B,
- a 10-probe apparatus for non-adjacent terminals as at 350.

The sensor probes may be inserted into recesses of terminal lugs, such as terminal lugs connected to the terminal blocks. For example, a high terminal block rated for 250 A may use electrical cable connections of terminal lugs, such as mechanical lugs. The terminal lug may include a hole or recess, into which a conducting probe may be inserted with associated sensor, controller, etc.

Figure 4:
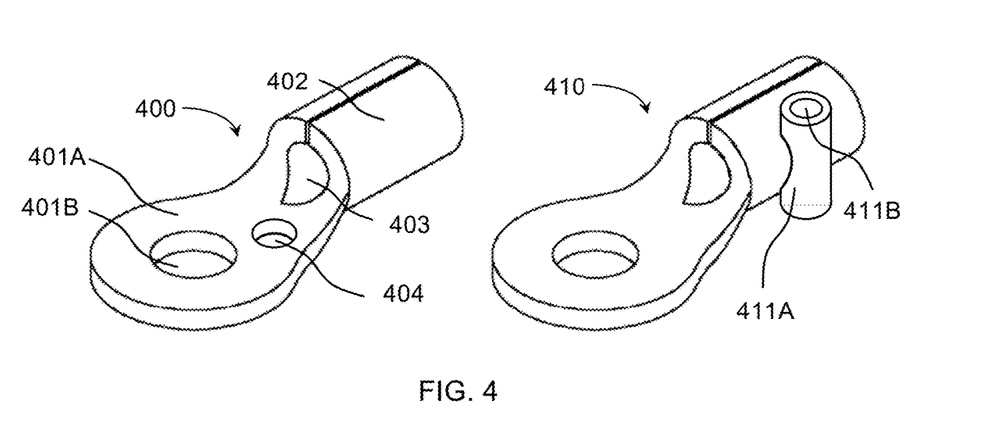
FIG. 4 shows, schematically, examples of terminal lugs with monitoring sensor recesses.

Reference is now made to FIG. 4, which shows, schematically, examples of terminal lugs 400 and 410 with monitoring sensor recesses. The terminal lug 400 comprises a flange 401A and a terminal connection recess 401B. A bolt or screw is inserted through terminal connection recess 401B and tightened to electrically connect flange 401A to a terminal block. An electrical cable or wire is connected to the terminal lug 400 by inserting the bare conductor (such as after removal of insulation) into a cable recess 403 and crimping the terminal lug body 402 around the conductor. A sensor recess 404 is positioned along flange 401A and the sensor apparatus probe inserted through recess 404 to allow the sensor attached to the probe to receive a physical property of the terminal, such as voltage and/or temperature. Terminal lug 410 is similar to terminal lug 400, but sensor recess 411B is located within a dedicated body element 411A protruding from the body of terminal lug 410. A sensor recess on the terminal lug may be used for measuring the voltage or temperature before the conductor reaches the terminal block (thus enabling the calculation of a temperature or voltage drop across the terminal block). In this configuration, the terminal block does not require a recess (such as a bridge or jumper recess). Since the probe and sensor may be incorporated into the terminal lug, fewer connections may be needed to connect during installation and hence the reliability may be improved over sensor apparatuses incorporated into the terminal blocks. Illustrated in FIG. 4 is a ring lug or eyelet lug, but similar aspects, with appropriate modification, may incorporate a fork lug, a pin lug, and/or a flange lug.

Figure 5A:
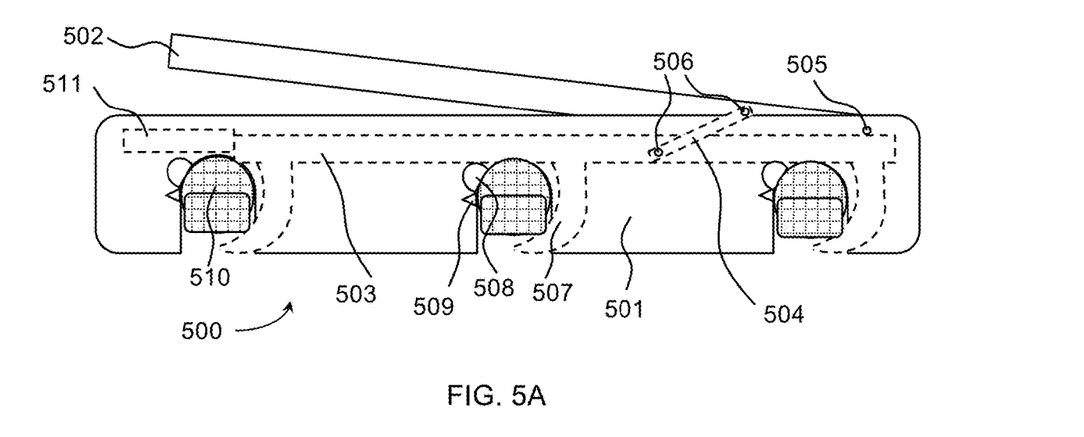
FIG. 5A shows, schematically, an example of a terminal sensor clamp apparatus.

Reference is now made to FIG. 5A, which shows, schematically, an example of a terminal sensor clamp apparatus 500. Some figures herein contain multiple similar parts, and where relevant, the references have been made to one of the parts. It may be understood that due to the analogous nature of the multiple parts, the description of one of the parts may apply to the other corresponding parts. For example, when multiple lugs are arranged in a parallel manner to one of the lugs, as at 510. Apparatus 500 comprises a body 501 and a clamp 503 that may clamp around a terminal lug (similar or identical to terminal lug 400 or 410 of FIG. 4) as at 510, thereby connecting sensors (as at 508 and 509) to the series of terminal lugs (as at 510). Body 501 and clamp 503 may comprise conducting probes for transferring a physical property from the terminal lugs 510 to sensors 508 and 509, such as comprising a conducting material (electrically conducting and/or thermally conducting). The clamp 503 may have clamping teeth 507, one for each terminal lug 510. The clamp 503 may be pressed against the lugs using a spring or elastic device 511. The clamp 503 may be separated from terminal lugs 510 by using a level 502 operating around pivot 505, that when opened away from body 501 uses link arm 504 operating through pivots 506 to pull the clamping teeth 507 away from terminal lugs 510.

Figure 5B:
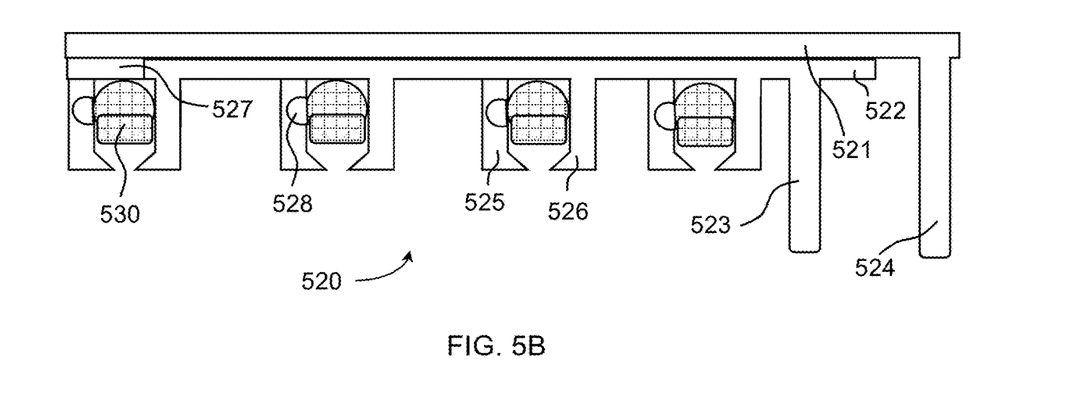
FIG. 5B shows, schematically, another example of a terminal sensor clamp apparatus.

Reference is now made to FIG. 5B, which shows, schematically, another example of a terminal sensor clamp apparatus 520. The apparatus 520 comprises two sliding parts 521 and 522, where part 521 comprises a handle 524 and clamping appendages 525, and part 522 comprises a handle 523 and clamping appendages 526. Clamping appendages 525 and 526 may be conducting probes for transferring a physical property from terminal lugs 530 to sensors 528, such as comprising a conducting material (electrically conducting and/or thermally conducting). An elastic member 527 pulls clamping appendages 525 and 526 towards each other thereby applying pressure to terminal lugs 530 between them and pressing sensors 528 against terminal lugs 530. Operating handles 523 and 524 by grasping and pulling the handles towards each other, may allow inserting terminal lugs 530 between clamping appendages 525 and 526.

Figure 6:
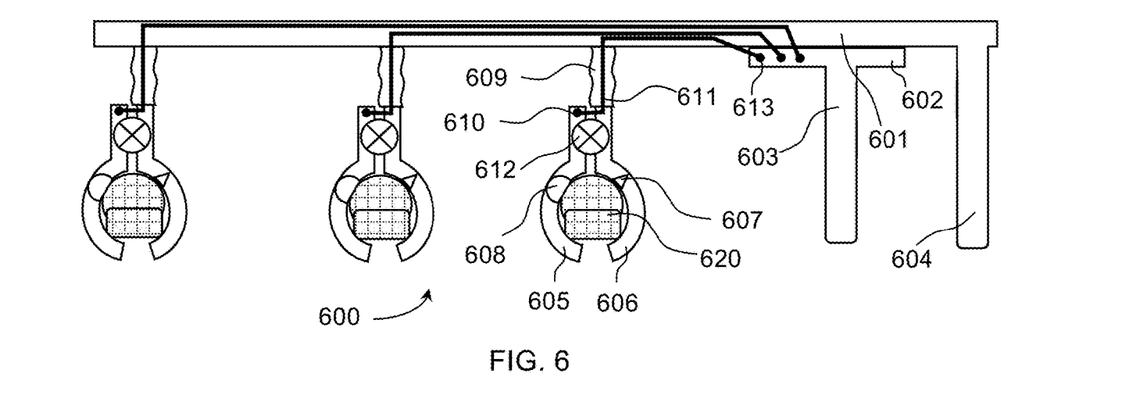
FIG. 6 shows, schematically, an example of flexible terminal sensor clamp apparatus.

Reference is now made to FIG. 6, which shows, schematically, an example of flexible terminal sensor clamp apparatus 600. Similarly to clamping appendages 525 and 526 of FIG. 5B, apparatus 600 comprises clamps as at 605 and 606 which press sensors as at 607 and 608 against terminal lugs 620. Clamps 605 and 606 may be conducting probes for transferring a physical property from terminal lugs 620 to sensors 607 and 608, such as comprising a conducting material (electrically conducting and/or thermally conducting). Elastic members 612, such as a spring, forces clamps 605 and 606 (and sensors 607 and 608) against terminal lugs 620. Handle 604 may be attached to part 601, handle 603 may be attached to part 602, part 602 may be attached as at 613 to one opening cable as at 611 per clamp pair, and cable 611 may penetrate first clamp 606 and may be anchored as at 610 on second clamp 605. To open the clamps, handles 603 and 604 may be pressed together, which may pull cables 611 such that the distal end of clamps 605 and 606 are pulled together, thereby opening the clamp for encompassing terminal lugs 620. Each clamp pair may be connected to part 601 with a flexible neck 609, so that small variations in positions of terminal lugs 620 have minor effect on the clamping strength and mechanism. Flexible neck 609 may comprise a lateral flexibility (side-to-side motion), and a longitudinal stiffness (along the length), enabling motion to the sides but allowing the opening clamp mechanism to operate.

Figure 7A:
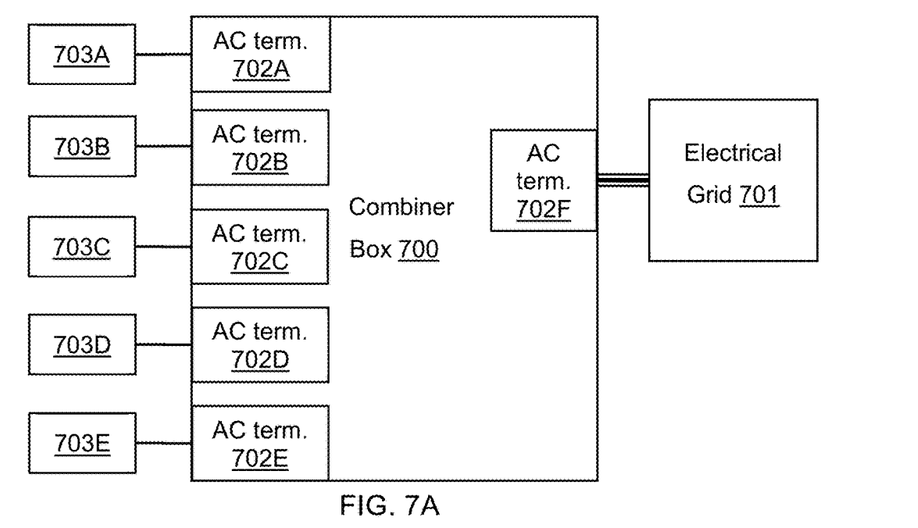
FIG. 7A shows, schematically, a combiner box with terminal sensor probes.
Figure 7B:
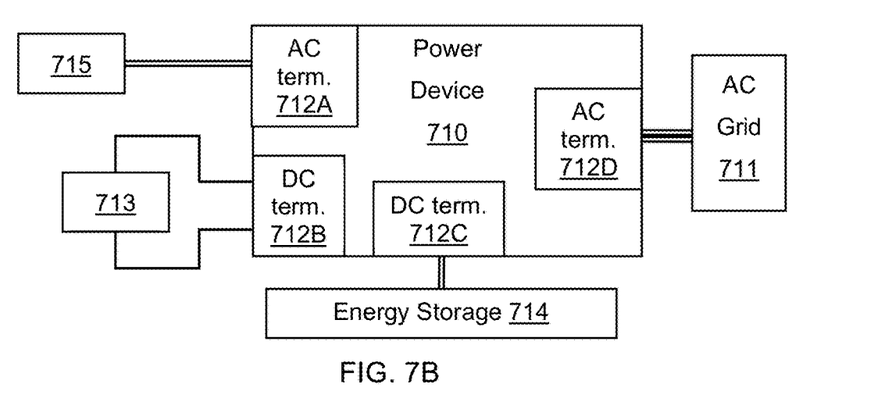
FIG. 7B shows, schematically, a power device with terminal sensor probes.
Figure 7C:
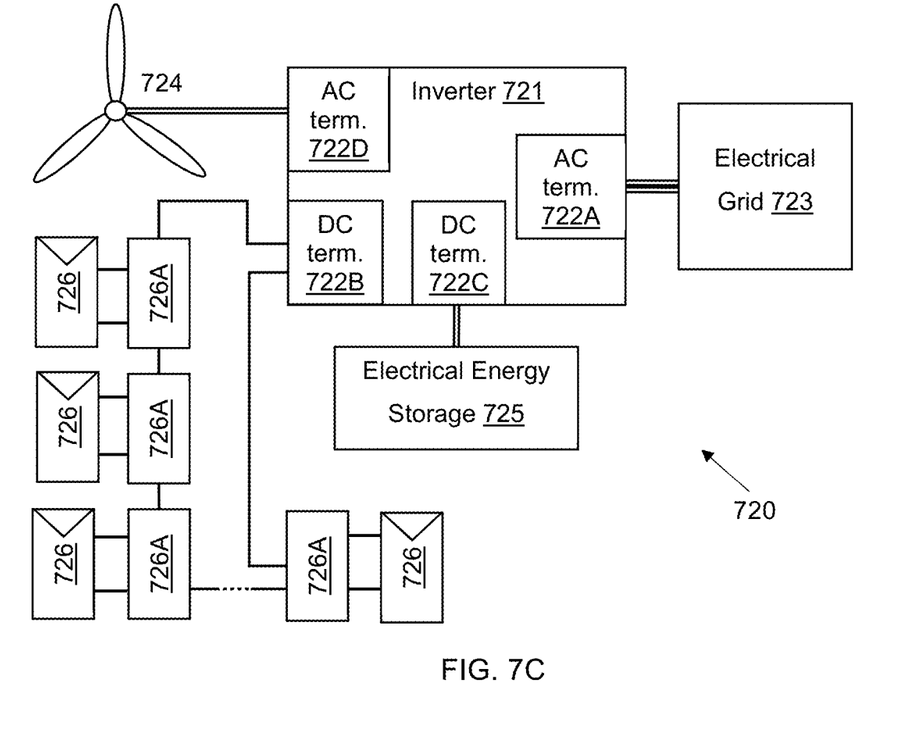
FIG. 7C shows, schematically, a power generation system with terminal sensor probes.

The following FIGS. 7A, 7B, and 7C depict example devices and systems that may incorporate aspects of a sensor apparatus coupled to an electrical terminal, and as such, the terminal is depicted in these examples already incorporated into the AC or DC terminal, as the case may be. Reference is now made to FIG. 7A, which shows, schematically, a combiner box 700 with terminal sensor probes. Combiner box 700 may comprise terminals with sensors probes 702A, 702B, 702C, 702D, 702E, and 702F, such as AC terminals (alternatively, the AC terminals may be configured for DC electrical power combining), each comprising a probe and sensor (not shown), such as the probes 101, 111, 131, 141, and 204, and sensors 104, 114, 132, 205, 508, 509, 528, 607, and 608 described in previous figures. Power sources 703A, 703B, 703C, 703D, and 703E each connect to one of input terminals 702A, 702B, 702C, 702D, and 702E, and for example output terminal 702F may be connected to an electrical grid 701 and/or other power device (not shown). Combiner box 700 may comprise a controller (not shown— such as or similar to controllers 107, 117, 142, 207, or 333) that monitors the sensors (such as or similar to sensors 104, 114, 132, 141, 205, 508, 509, 528, 607, or 608), and when a sensor value exceeds a threshold, such as an over-temperature threshold, an over-resistance threshold, an over/under-voltage threshold, a overpower dissipation threshold, and/or an abnormal terminal sensor value threshold (by comparing to other sensor values), the controller may send a message to a host system or user interface indicating the exceeded threshold and the terminal identifier (for assistance in initiating a repair of the faulty terminal).

Reference is now made to FIG. 7B, which shows, schematically, a power device 710 with terminal sensor probes. Power device 710 may comprise terminals with sensor probes 712A, 712B, 712C, and 712D, which may be AC or DC terminals, each comprising a probe and a sensor (not shown—such as or similar to controllers 107, 117, 142, 207, or 333). Power sources/sinks 713, 714, and 715, may be connected to input terminals with sensor probes 712B, 712C, 712A, respectively. For example, device 715 may be a wind power generator connected to AC terminal 712A. For example, device 713 may be a solar power generator connected to DC terminal 712B. For example, device 714 may be an energy storage device, such as a residential home lithium ion battery, connected to DC terminal 712C. Power device 710 may comprise an output terminal 712D connected to an electrical grid 711. Power device 710 may comprise a controller (not shown) that monitors the sensors, and when a sensor value exceeds a threshold, such as an over-temperature threshold, an over-resistance threshold, an over/under-voltage threshold, a overpower dissipation threshold, and/or an abnormal terminal threshold (by comparing to the other sensor values), the controller may send a message to a host system or user interface indicating the exceeded threshold and the terminal identifier (for assistance in initiating a repair of the faulty terminal).

Reference is now made to FIG. 7C, which shows, schematically, a power generation system 720 with terminal sensor probes. Power generation system 720 may comprise an inverter 721, a wind power generator 724, solar panels 726 (each connected using a junction box or optimizer 726A), and/or electrical energy storage 725 (such as a battery). Inverter 721 may comprise terminals with sensor probes 722A, 722B, 722C, and 722D, which may be AC or DC terminals, each comprising an integrated probe and sensor (not shown explicitly). Various power devices (such as wind power generator 724, electrical energy storage 725, and solar panels 726 using devices 726A), may be connected to input terminals with respective sensor probes 722B, 722C, and 722D. Inverter 721 via output terminal with sensor probe 722A may be connected to electrical grid 723. Inverter 721 may comprise a controller (not shown) that monitors the sensors, and when a sensor value exceeds a threshold, such as an over-temperature threshold, an over/under-voltage threshold, an over-resistance threshold, a overpower dissipation threshold, and/or an abnormal terminal threshold (by comparing to the other sensor values), the controller may send a message to a host system or user interface indicating the exceeded threshold and the terminal identifier (for assistance in initiating a repair of the faulty terminal).

Here, as elsewhere in the specification and claims, ranges can be combined to form larger ranges.

Specific dimensions, specific materials, specific ranges, specific resistivities, specific voltages, specific shapes, and/or other specific properties and values disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (for example, the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

In the description of various illustrative features, reference is made to the accompanying drawings, which form a part hereof, and in which is shown, by way of illustration, various features in which aspects of the disclosure may be practiced. It is to be understood that other features may be utilized and structural and functional modifications may be made, without departing from the scope of the present disclosure.

Terms such as "multiple" as used in this disclosure indicate the property of having or involving several parts, elements, or members.

It may be noted that various connections are set forth between elements herein. These connections are described in general and, unless specified otherwise, may be direct or indirect; this specification is not intended to be limiting in this respect, and both direct and indirect connections are envisioned. Further, elements of one feature in any of the embodiments may be combined with elements from other features in any of the embodiments, in any combinations or sub-combinations.

All described features, and modifications of the described features, are usable in all aspects of the inventions taught herein. Furthermore, all of the features, and all of the modifications of the features, of all of the embodiments described herein, are combinable and interchangeable with one another.

What is claimed is:

1. An apparatus comprising:
   a terminal lug adapted to mechanically and electrically connect an electrical cable to an electrical terminal, wherein the terminal lug comprises:
   a flange configured to attach and electrically connect the terminal lug to the electrical terminal,
   a terminal recess in the flange configured to allow insertion of a bolt or screw of the electrical terminal, a cable clamp configured to attach and electrically connect the terminal lug to the electrical cable, and a sensor recess; and a sensor configured to measure a physical property of the electrical terminal, wherein the sensor recess is configured to secure the sensor.

2. The apparatus of claim 1, wherein the sensor recess is located on the flange or the cable clamp.

3. The apparatus of claim 1, wherein the terminal lug comprises a dedicated body element protruding from the terminal lug, wherein the sensor recess is located on the dedicated body element.

4. The apparatus of claim 1, wherein the flange is configured as a ring lug, an eyelet lug, a fork lug, a pin lug, or a flange lug.

5. The apparatus of claim 1, wherein the cable clamp comprises a cable recess configured to receive the electrical cable.

6. The apparatus of claim 1, wherein the physical property is a temperature and the sensor is a temperature sensor.

7. The apparatus of claim 1, wherein the physical property is a voltage and the sensor is a voltage sensor.

8. The apparatus of claim 1, wherein the sensor recess is substantially smaller than the terminal recess.

9. A method comprising:

connecting an electrical cable mechanically and electrically to a cable clamp of a terminal lug;

inserting a sensor into a sensor recess of the terminal lug;

connecting a flange of the terminal lug electrically and mechanically to an electrical terminal; and tightening a bolt or screw in a terminal recess in the flange of the electrical terminal to secure the terminal lug to the electrical terminal, wherein the sensor is connected to a monitoring circuit, and wherein the sensor is configured to measure a physical property of the electrical terminal.

10. The method of claim 9, further comprising:

measuring, using the monitoring circuit, sensor values from the sensor to monitor the physical property of the electrical terminal; and determine that the sensor values comply with a monitoring rule; and initiate, based on the determining, an action using the monitoring circuit.

11. The method of claim 9, wherein the physical property is a temperature and the sensor is a temperature sensor.

12. The method of claim 9, wherein the physical property is a voltage and the sensor is a voltage sensor.

13. The method of claim 9, wherein the sensor recess is substantially smaller than the terminal recess.

14. A system comprising:

a plurality of solar panels connected in a serial string;

an inverter connected to ends of the serial string, wherein the inverter comprises a plurality of electrical terminals; and a plurality of terminal lugs, each comprising:

a cable clamp configured to attach and electrically connect the terminal lug to an electrical cable;

a flange attached and electrically connected to a corresponding electrical terminal of the plurality of electrical terminals;

a terminal recess configured to allow insertion of a bolt or screw of the corresponding electrical terminal;

a sensor configured to receive a physical property of the corresponding electrical terminal; and a sensor recess configured to receive the sensor.

15. The system of claim 14, wherein the sensor recess is located on the flange or the cable clamp.

16. The system of claim 14, wherein each terminal lug of the plurality of terminal lugs further comprises a dedicated body element protruding from the terminal lug, wherein the sensor recess is located on the dedicated body element.

17. The system of claim 14, wherein the flange of each terminal lug of the plurality of terminal lugs is configured as a ring lug, an eyelet lug, a fork lug, a pin lug, or a flange lug.

18. The system of claim 14, wherein the physical property is a temperature and the sensor is a temperature sensor.

19. The system of claim 14, wherein the physical property is a voltage and the sensor is a voltage sensor.

20. The system of claim 14, wherein, for each terminal lug of the plurality of terminal lugs, the sensor recess is substantially smaller than the terminal recess.

* * * * *